(12) United States Patent
Tessier et al.

(10) Patent No.: US 7,718,514 B2
(45) Date of Patent: May 18, 2010

(54) METHOD OF FORMING A GUARD RING OR CONTACT TO AN SOI SUBSTRATE

(75) Inventors: Amanda L. Tessier, Poughkeepsie, NY (US); Bryant C. Colwill, Poughkeepsie, NY (US); Brian L. Tessier, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 11/769,912

(22) Filed: Jun. 28, 2007

(65) Prior Publication Data

US 2009/0001465 A1 Jan. 1, 2009

(51) Int. Cl.
*H01L 21/20* (2006.01)

(52) U.S. Cl. ............................. 438/479; 257/E21.564

(58) Field of Classification Search ............... 438/141, 438/295, 311, 479; 257/E21.564
See application file for complete search history.

(56) References Cited

U.S. PATENT DOCUMENTS

| | | | | |
|---|---|---|---|---|
| 5,276,338 A | * | 1/1994 | Beyer et al. .................. 257/52 |
| 6,121,661 A | * | 9/2000 | Assaderaghi et al. ........ 257/355 |
| 6,429,502 B1 | * | 8/2002 | Librizzi et al. .............. 257/510 |
| 6,521,947 B1 | * | 2/2003 | Ajmera et al. ............... 257/347 |
| 6,566,713 B2 | * | 5/2003 | Nii .............................. 257/347 |
| 6,573,565 B2 | * | 6/2003 | Clevenger et al. ........... 257/355 |
| 6,611,024 B2 | * | 8/2003 | Ang et al. .................... 257/350 |
| 6,670,716 B2 | | 12/2003 | Christensen et al. |
| 6,921,711 B2 | | 7/2005 | Cabral, Jr. et al. |
| 7,009,249 B2 | * | 3/2006 | Nii .............................. 257/347 |
| 2003/0203546 A1 | * | 10/2003 | Burbach et al. ............. 438/151 |
| 2004/0121599 A1 | * | 6/2004 | Aminpur et al. ............ 438/689 |
| 2005/0212071 A1 | * | 9/2005 | Yue et al. .................... 257/452 |

* cited by examiner

*Primary Examiner*—Lex Malsawma
(74) *Attorney, Agent, or Firm*—Yuanmin Cai; Daryl Neff (57) ABSTRACT

A method is provided of forming a conductive via in contact with a bulk semiconductor region of a semiconductor-on-insulator ("SOI") substrate. A first opening is formed in a conformal layer overlying a trench isolation region. The trench isolation region may share an edge with an SOI layer of the substrate. Desirably, a dielectric layer is deposited over a top surface of the conformal layer and the trench isolation region. A second opening can then be formed which extends through the dielectric layer and the first opening in the conformal layer. Desirably, portions of the bulk semiconductor region and the top surface of the conformal layer are exposed within the second opening. The second opening can then be filled with at least one of a metal or a semiconductor to form a conductive element contacting the exposed portions of the bulk semiconductor region and the top surface of the conformal layer.

9 Claims, 8 Drawing Sheets

METHOD OF FORMING A GUARD RING OR CONTACT TO AN SOI SUBSTRATE

BACKGROUND OF THE INVENTION

The present invention relates to microelectronic devices and their fabrication.

In ordinary semiconductor substrates, the active semiconductor region of a transistor is disposed in a well region of an oppositely doped bulk semiconductor region. In such structure, junction capacitance between the well and the bulk semiconductor region can impact performance. For increased performance, some microelectronic devices have active semiconductor regions in a silicon-on-insulator ("SOI") layer of an SOI substrate. The SOI layer is separated from the main or "bulk" semiconductor region of the substrate by an insulating layer such as a buried oxide ("BOX") layer or other dielectric layer. The insulating layer improves performance by eliminating junction capacitance between the SOI layer and the bulk semiconductor region.

Figure 1:
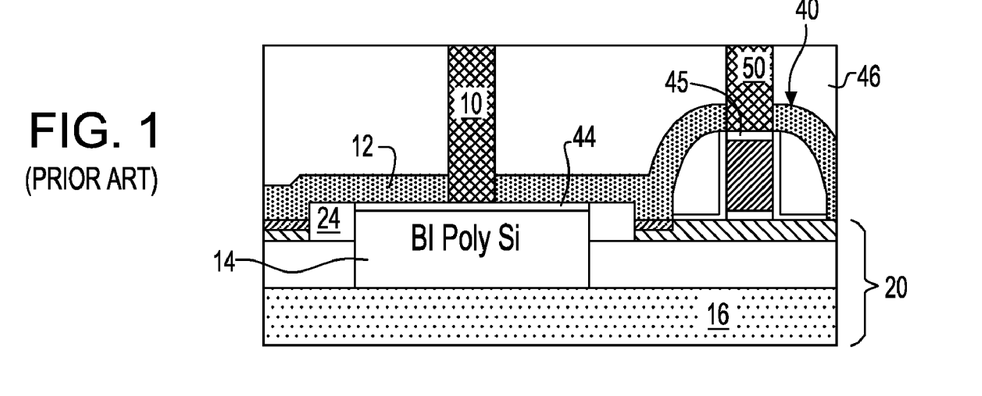
FIG. 1 is a sectional view illustrating a prior art structure including a conductive via.

However, SOI substrates are more complex than ordinary semiconductor substrates. More complex processing is required to form devices and to assure that they remain functional during use. In particular, SOI substrates require conductive vias to pass through the BOX layer and contact the bulk semiconductor region. In this way, the SOI substrate serves as a common node or ground node for devices. FIG. 1 illustrates a prior art contact structure in which a conductive via 10 extends through a stressed silicon nitride layer 12 and is electrically connected with a bulk semiconductor region 16 of an SOI substrate 20 through a polysilicon plug 14 covered with a silicide layer 44.

Figure 2:
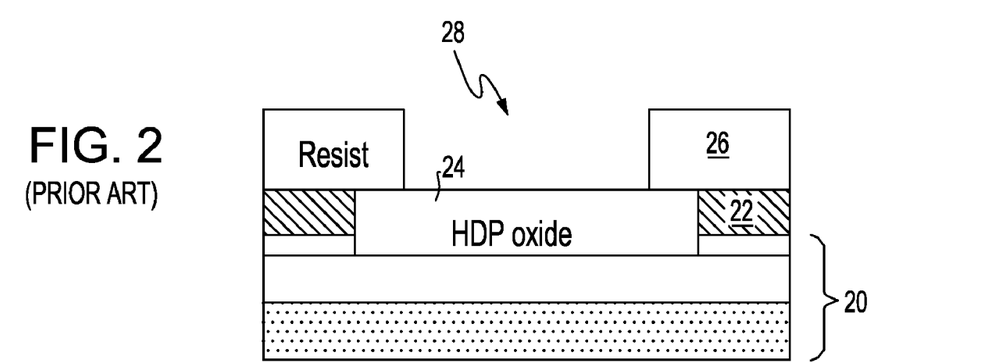
FIGS. 2-6 are sectional views illustrating a method of fabricating the prior art structure shown in FIG. 1.
Figure 3:
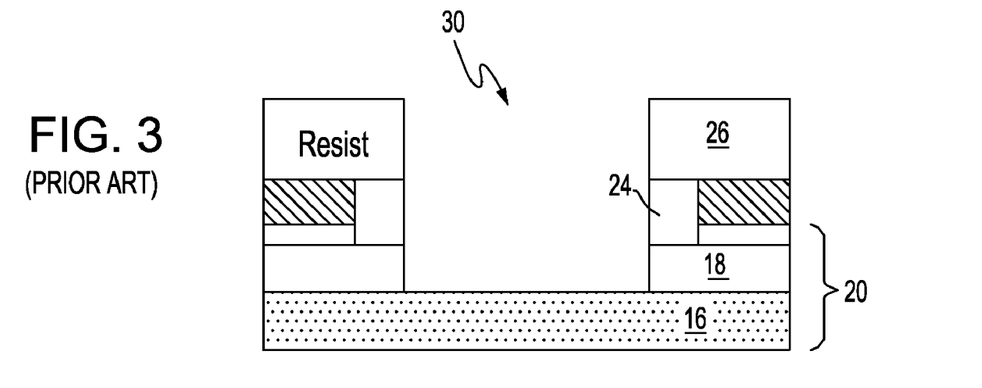
Figure 4:
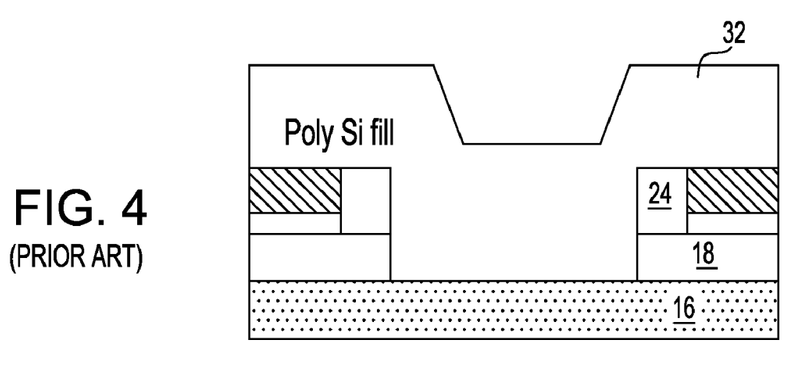
Figure 5:
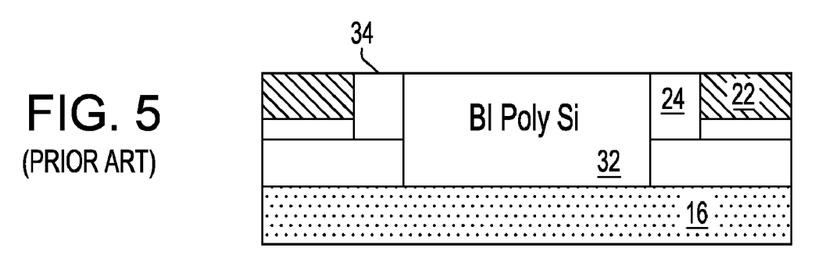
Figure 6:
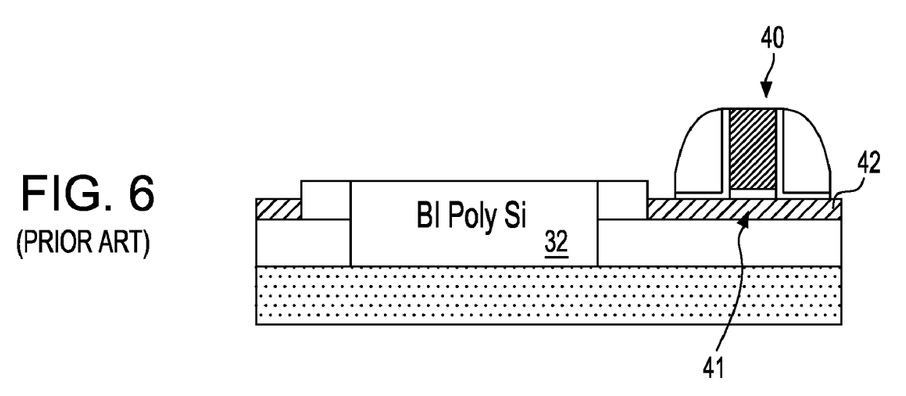

One drawback of the prior art contact structure is a number of processing steps which are needed only for the purpose of making the contact structure. To form the contact structure, an SOI substrate 20 (FIG. 2) having a trench isolation region 24 disposed therein and a nitride layer 22 thereon, is covered with a photoimageable layer 26, e.g., photoresist layer, which is then patterned to form an opening 28 within the boundaries of the trench isolation region 24 as shown in FIG. 2. As shown in FIG. 3, an opening 30 in the trench isolation region 24 and a BOX layer 18 of the substrate is patterned in accordance with the photoresist layer 26, such that the bulk semiconductor region 16 becomes exposed within the opening. As shown in FIG. 4, the photoresist is removed and then the opening in the trench isolation region 24 and the BOX layer 18 is filled with a layer of polysilicon 32 to contact the bulk semiconductor region 16. The polysilicon fill 32 contacting the bulk semiconductor region 16 then is reduced in height and planarized to a major surface of the trench isolation region 24 and the pad nitride layer 22 (FIG. 5). As illustrated in FIG. 6, the pad nitride layer then is removed, in which case the polysilicon plug 32 may protrude upwardly above an active semiconductor region 42 of the substrate. A device such as a field effect transistor 40 is formed which has a channel region 41 disposed within the active semiconductor region 42. Referring again to FIG. 1, regions 44, 45 of silicide then are formed atop the polysilicon plug 14 and atop a gate conductor of the FET 40, after which an interlevel dielectric layer 46 is formed. Conductive vias 10 and 50 then are formed which extend through the interlevel dielectric 46 and the stressed nitride layer 12 to contact the silicide layers 44, 45.

In such prior art method, the sole purpose of the processing described with respect to FIGS. 3, 4 and 5 is to form the polysilicon plug 14 that makes up part of the conductive structure contacting the bulk substrate region 16. It would be desirable to reduce the amount of processing required to form the conductive contact structure.

SUMMARY OF THE INVENTION

In accordance with an embodiment of the invention, a method is provided of forming a conductive via in contact with a bulk semiconductor region of a semiconductor-on-insulator ("SOI") substrate. A first opening is formed in a conformal layer overlying a trench isolation region. The trench isolation region may share an edge with an SOI layer of the substrate. Desirably, a dielectric layer is deposited over a top surface of the conformal layer and the trench isolation region. A second opening can then be formed which extends through the dielectric layer and the first opening in the conformal layer. Desirably, portions of the bulk semiconductor region and the top surface of the conformal layer are exposed within the second opening. The second opening can then be filled with at least one of a metal or a semiconductor to form a conductive element contacting the exposed portions of the bulk semiconductor region and the top surface of the conformal layer.

In accordance with another embodiment of the invention, a microelectronic structure is provided which can include a conductive element contacting a bulk semiconductor region of a semiconductor-on-insulator ("SOI") substrate. A trench isolation region may overlie the buried dielectric layer. The trench isolation region may share an edge with the SOI layer. Desirably, a conformal layer overlies the trench isolation region. The conformal layer may have a top surface and an opening which define a wall extending from the top surface towards the trench isolation region. The top surface of the conformal layer may include a lip portion adjacent to the wall. Desirably, a dielectric layer overlies the top surface of the conformal layer. Desirably, a conductive element is provided in conductive communication with the bulk semiconductor region. The conductive element may consist essentially of at least one of a semiconductor, a metal or a conductive compound of a metal, for example. The conductive element may extend through the dielectric layer, the opening in the conformal layer, the trench isolation region and the buried dielectric layer. Desirably, the conductive element contacts a lip portion of the conformal layer.

DETAILED DESCRIPTION

Figure 7A:
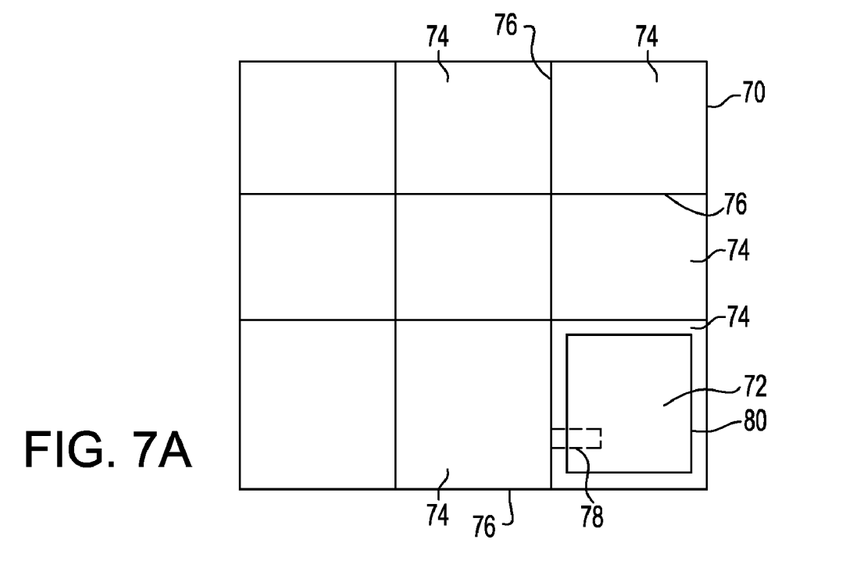
FIG. 7A is a plan view illustrating a substrate including a plurality of microelectronic elements, each having a guard ring, in accordance with an embodiment of the invention.

Microelectronic structures, e.g., semiconductor chips, which include a guard ring or conductive via in contact with a bulk semiconductor region of an SOI substrate are described herein as well as methods for fabricating such structures. FIG. 7A is a plan view illustrating a substrate 70, e.g., a wafer or portion of a wafer which includes a plurality of individual regions 74. Each region 74 typically represents a microelectronic structure such as a semiconductor chip having an integrated circuit thereon or a portion of such chip. Lines 76 indicate boundaries of the regions. In one example, the lines 76 indicate locations of dicing lanes at which the regions 74 will be separated into individual chips. A conductive guard ring 80 circumscribes or at least substantially surrounds an area 72 of a region 74, e.g., an area 72 of an individual chip or an area smaller than the area of an individual chip. A guard ring can function as a barrier to the transport of ions and moisture, benefiting the reliability of the microelectronic devices it surrounds. The area 72 enclosed by the guard ring typically represents a device region of the chip, i.e., a region containing microelectronic devices. A guard ring of a completed microelectronic chip usually is complemented by additional overlying rings of metallic vias and wiring which overlie the guard ring 110 shown in FIG. 7D and extend through most or all of the thickness of the wiring levels provided on the microelectronic chip.

Figure 7B:
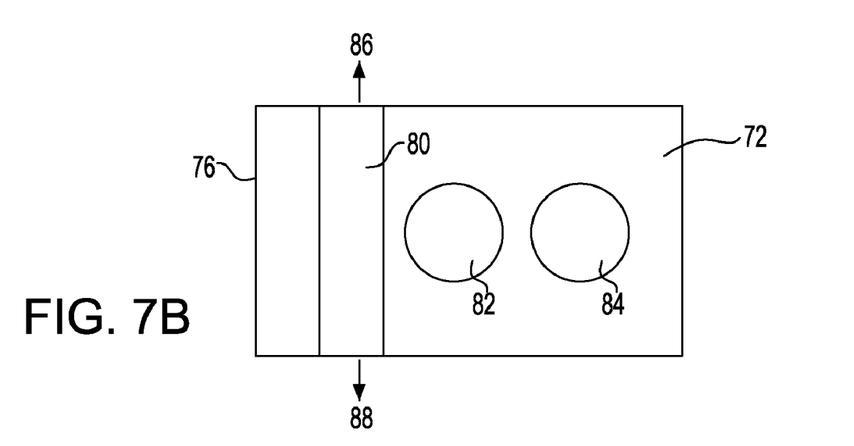
FIG. 7B is a fragmentary plan view illustrating a portion of a microelectronic element having a guard ring and conductive vias in accordance with an embodiment of the invention.

A fragment 78 of one region 74 is illustrated in greater detail in the plan view provided in FIG. 7B. As shown therein, guard ring 80 adjacent to dicing lane 76 extends in directions 86, 88. Guard ring 80 is fabricated so as to contact a bulk semiconductor region of the SOI substrate, as will be described in greater detail below. Conductive vias 82, 84 contact one or more active semiconductor regions of microelectronic devices in the device region 72 of an SOI layer of the substrate.

Figure 7C:
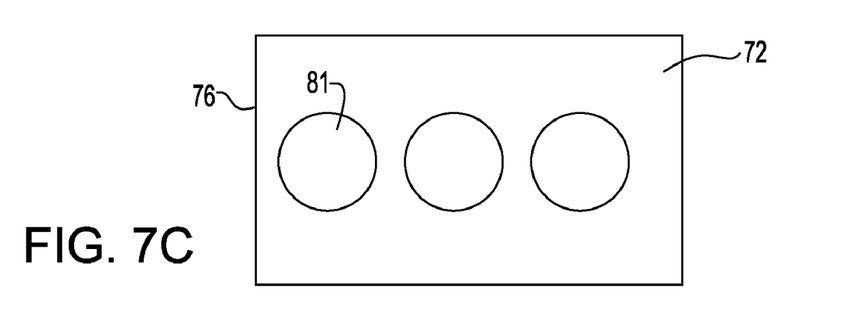
FIG. 7C is a fragmentary plan view illustrating a portion of a microelectronic element having conductive vias in accordance with an embodiment of the invention.

Alternatively, as shown in FIG. 7C, instead of a guard ring, a conductive element can be provided in form of a conductive via 81 which contacts the bulk semiconductor region of the SOI substrate. As shown in FIG. 7C, the conductive via 81 may lie adjacent to dicing lane 76 as illustrated in FIG. 7C. Alternatively, the conductive via 81 can lie elsewhere, such as embedded within device region 72, or within an area enclosed by a guard ring 80 (FIG. 7B).

Figure 7D:
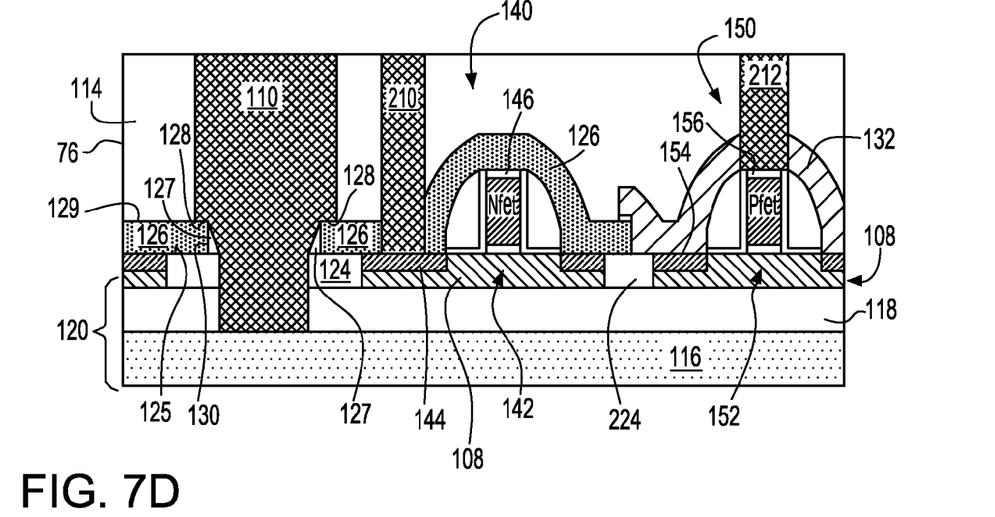
FIG. 7D is a sectional view illustrating a microelectronic element as shown in FIG. 7A or FIG. 7B, in accordance with an embodiment of the invention.

FIG. 7D is a detailed sectional view illustrating a microelectronic structure having a conductive element 110, e.g., a guard ring or conductive substrate contact via in accordance with an embodiment of the invention. For ease of reference, the conductive element will be described as a guard ring. However, the following description of the conductive element and its fabrication can apply as well to a conductive substrate contact via 81 (FIG. 7C).

The guard ring 110 is in conductive communication with the bulk semiconductor region 116 of an SOI substrate 120. The SOI substrate typically includes a silicon-on-insulator structure having a device layer 108 of monocrystalline silicon separated from a bulk silicon region 116 by a buried oxide ("BOX") layer 118. The device layer 108 may consist essentially of silicon, or may include an alloy of silicon, e.g., silicon germanium, silicon carbon, among others, or the device layer may include a portion consisting essentially of silicon and another portion consisting essentially of an alloy of silicon. A first trench isolation region 124 separates an edge region of the chip adjacent to dicing lane 76 from a device region containing microelectronic devices e.g., an n-type field effect transistor (NFET) 140, and a p-type field effect transistor (PFET) 150. At least a first conformal layer 126 and, desirably, a second conformal layer 132 overlie an active semiconductor layer 108 (SOI layer) of the substrate and the trench isolation regions 124, 224.

A top surface 129 of the conformal layer is adjacent to an interlevel dielectric layer 114. In order from top to bottom, the guard ring 110 overlies and desirably contacts a lip portion 128 of conformal layer 126 at the top surface 129. The guard ring 110 extends through an interlevel dielectric ("ILD") layer 114, the trench isolation region 124 and the BOX layer 118 of the SOI substrate. As further shown in FIG. 7D, the first conformal layer 126 overlies NFET 140. Typically, the conformal layer 126 includes an internally stressed dielectric material. For example, the conformal layer 126 can include silicon nitride having an internal stress. The magnitude of the internal stress usually is greater than 0.5 gigapascals ("GPa"). The conformal layer 126 can have an internal stress which is tensile or compressive. Desirably, the conformal layer 126 has tensile stress having a magnitude greater than about 1.0 GPa in order to apply a beneficial tensile stress to a channel region of the NFET.

As further shown in FIG. 7D, spacers 127 may be disposed along walls 130 of the first conformal layer 126. Typically, the spacers 127 are formed by a process which patterns a second conformal layer 132 overlying PFET 150. The conformal layer 132 may also include internally stressed silicon nitride. The conformal layer 132 desirably has compressive stress having a magnitude greater than about 1.0 GPa in order to apply a beneficial compressive stress to a channel region of the PFET.

The NFET 140 and the PFET 150 have active semiconductor regions 142 and 152, respectively, disposed in the SOI layer 108 of the substrate 120. The active semiconductor regions are separated by a second trench isolation region 224. A first contact via 210 extends through the first conformal layer 126 to contact a silicide layer 144 in conductive communication with the active semiconductor region 142 of the NFET. A second contact via 212 extends through the second conformal layer 132 to contact a silicide layer 156 of a gate conductor of the PFET 150. Typically, other conductive vias (not shown) are also present which extend through the ILD layer 114 and the first and second conformal layers 126, 132 to contact a silicide layer 146 of the gate conductor of the NFET and to contact a silicide layer 154 overlying the active semiconductor region 152 of the PFET, respectively.

Figure 8:
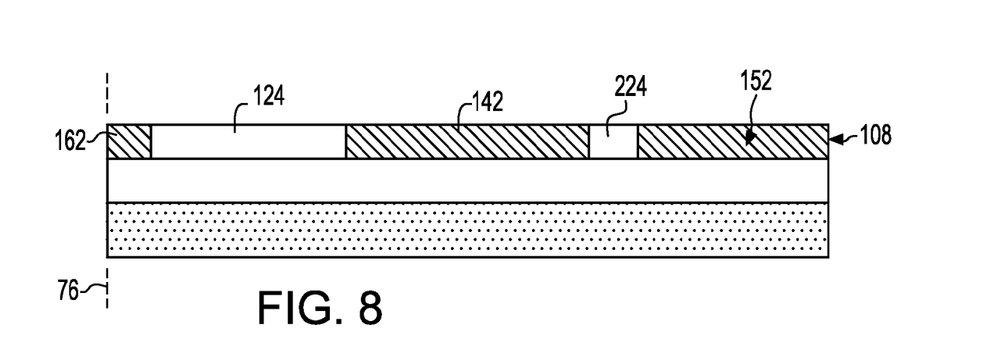
FIGS. 8-13 are sectional views illustrating stages in fabrication of the microelectronic element shown in FIG. 7D, in accordance with an embodiment of the invention.

A method of fabricating the microelectronic structure shown in FIG. 7A-7B, and 7D (or alternatively, FIG. 7C-7D) will now be described. In a preliminary stage of fabrication shown in FIG. 8, a first trench isolation region 224 separates active semiconductor regions 142, 152 of an SOI layer 108 of the substrate from each other. A second trench isolation region 124 separates active semiconductor region 142 from another semiconductor region 162 of the SOI layer, such as an edge region of the semiconductor region or chip near dicing lane 76.

Figure 9:
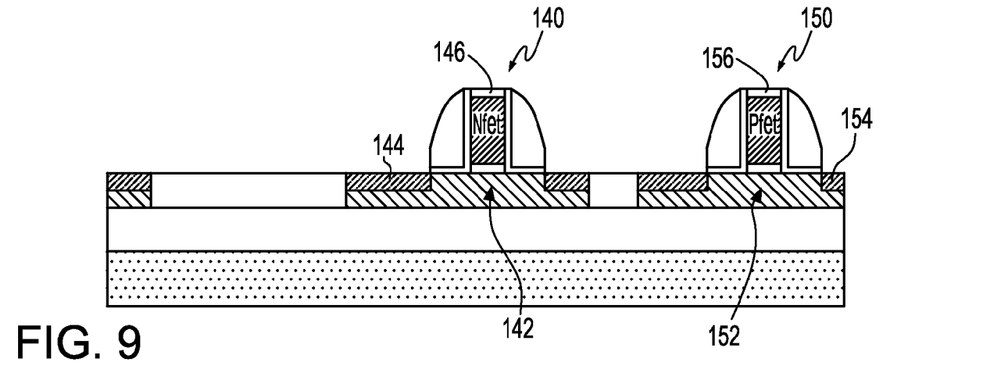

As shown in FIG. 9, microelectronic devices are formed in the respective active semiconductor regions. For example, an NFET 140 can be formed which has a channel region in active semiconductor region 142 and a PFET 150 can be formed which has a channel region in active semiconductor region 152. Silicide regions 146, 156 are formed which provide low contact resistance connections to the gate conductors of each transistor and silicide regions 144, 154 provide low contact resistance connections to the active semiconductor regions 142, 152, respectively.

Figure 10:
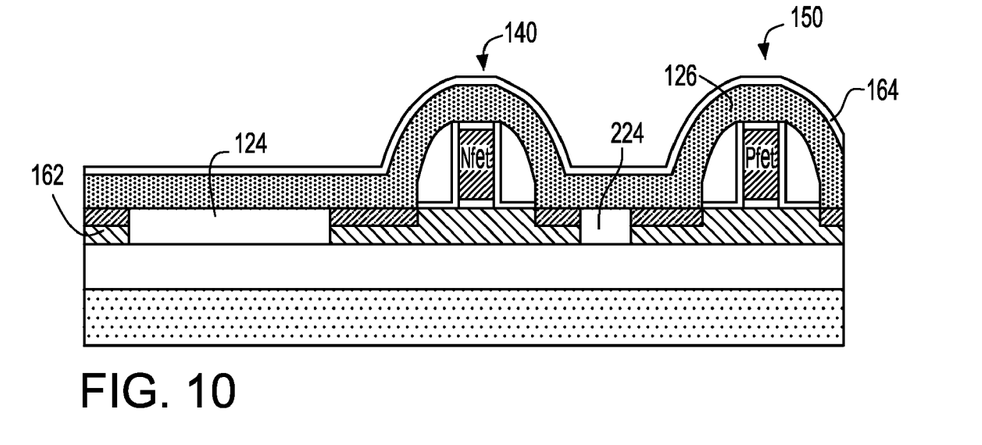
Figure 11:
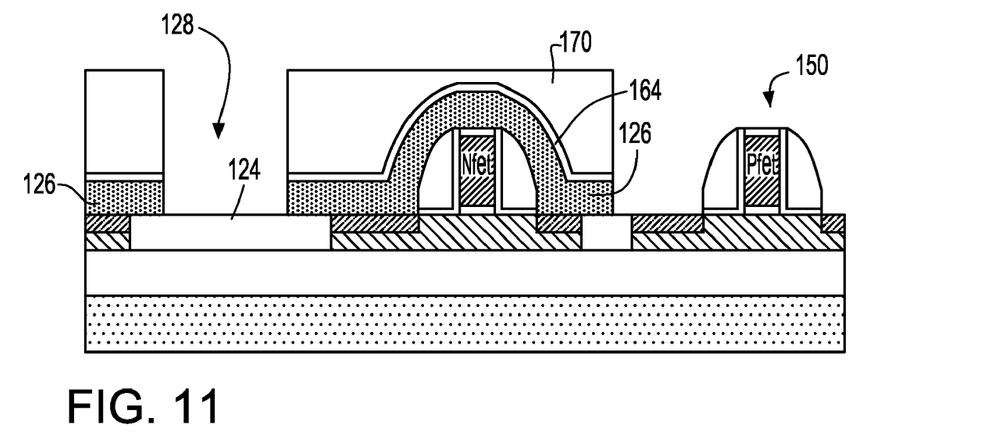

Next, as illustrated in FIG. 10, a first conformal layer 126, e.g., a tensile stressed silicon nitride layer, is deposited to overlie the PFET and the NFET, the trench isolation regions 124, 224 and semiconductor region 162. A hard mask layer 164 such as a layer of silicon dioxide then is deposited to cover the first conformal layer 126. As shown in FIG. 11, a resist mask layer 170 is formed by photolithographic patterning and then the hard mask layer 164 and first conformal layer 126 are patterned in accordance therewith to form an opening 128 overlying the trench isolation region 124 and an opening overlying the PFET 150.

Figure 12:
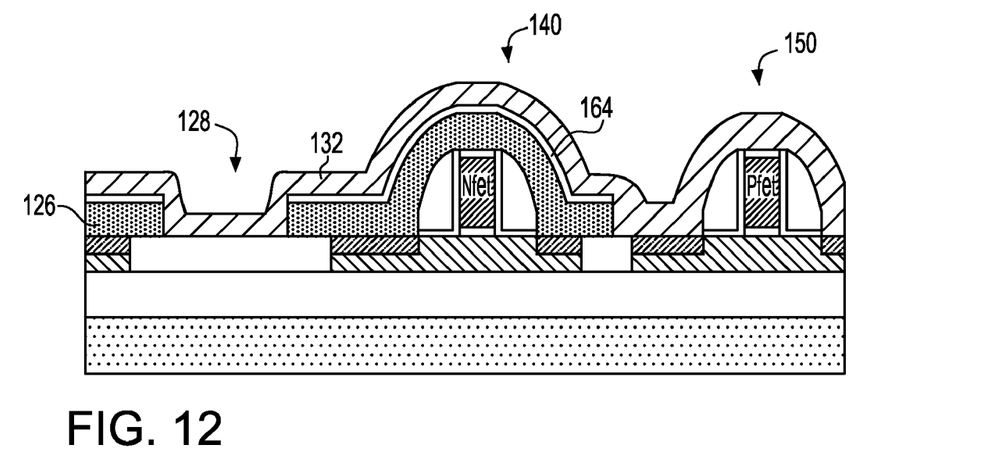
Figure 13:
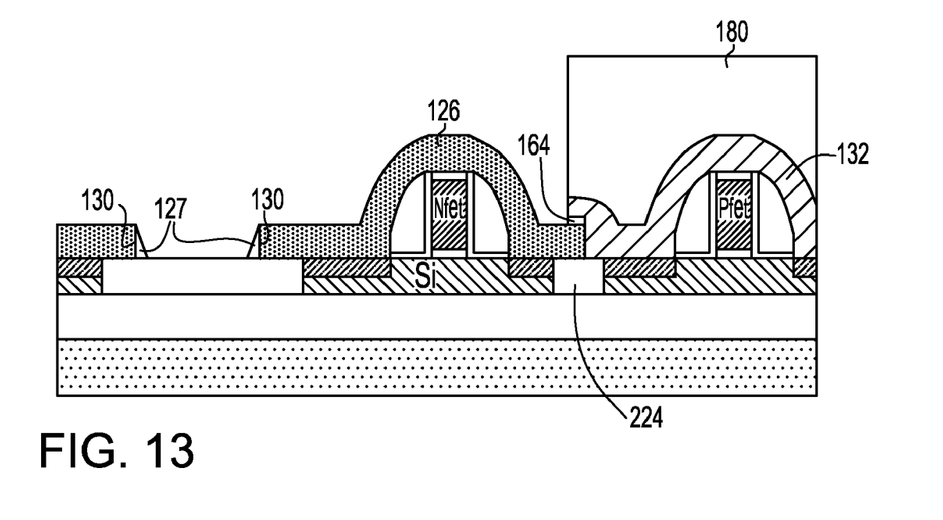

Thereafter, as shown in FIG. 12, the resist mask layer is removed and a second conformal layer 132 is deposited to overlie the structure including the PFET 150, the NFET 140, the first conformal layer 126, the hard mask layer 164 and within the opening 128. Then, as illustrated in FIG. 13, a further resist mask layer 180 is formed, after which exposed portions of the second conformal layer 132 are selectively removed. For example, an etching process which selectively attacks silicon nitride can be used to remove the second conformal silicon nitride layer 132 in relation to the oxide hard mask layer 164. This process results in the formation of spacers 127 along walls 130 of the first conformal layer 126, the spacers 127 including material remaining from etching the second conformal layer 132.

Thereafter, the oxide layer 164 can be removed, such that a portion of the oxide layer 164 remains only over a portion of the first conformal nitride layer 126 above the trench isolation region 224. Here, as shown in FIG. 13, the oxide layer 164 may be sandwiched between the first conformal layer 126 and the overlapping second conformal layer 132.

Referring again to FIG. 7D, to complete the structure, the ILD layer 114 is deposited over the structure and contact holes are then patterned in the ILD layer in locations corresponding to conductive vias 110, 210 and 212. The ILD layer 114 typically includes or consists essentially of an oxide of silicon, which may or may not be doped, e.g., such as a doped silicate glass. By forming a photoresist mask opening and etching in accordance therewith, an opening corresponding to guard ring 110 is formed which extends through the ILD layer, the trench isolation region 124 and the BOX layer. In one example, each of the ILD layer, the trench isolation region and the BOX layer consists essentially of an oxide of silicon. During the etch process, conditions are preferably controlled according to the requirements of forming the contact holes in which vias 210, 212 will be formed. For example, conditions of the etch process are controlled to allow sufficient amount of time to form openings extending through the first and second conformal layers 126, 132, wherever the openings appear on a wafer. Under such conditions, the etch process will then be sufficient to form the contact hole corresponding to via 110.

The opening corresponding to guard ring 110 can be formed under conditions different from those in which the contact holes for the vias 210, 212 are formed. For example, the opening corresponding to guard ring 110 can be formed by a process which selectively preserves the silicon nitride material present in the conformal layers 126, 132. In such way, a lip portion 128 of the top surface of the conformal layer 126 adjacent to the spacer 127 and opening in the trench isolation layer 124 is preserved. The guard ring can then be formed such that it contacts or lies directly above the lip portion 128 of the conformal nitride layer. Openings in the ILD layer corresponding to locations of vias 210, 212 may also be formed simultaneously, such openings exposing top surfaces of the respective silicon nitride layers 126, 132.

To form the holes in which conductive vias 210, 212 are to be disposed, another process can be used to etch through the silicon nitride layers 126, 132, exposing the respective silicide layers 144, 156. A semiconductor, a metal, a conductive compound of a metal, or a combination of such materials then is deposited to fill the contact holes, thus forming the guard ring 110 and conductive vias 210 and 212 shown in FIG. 7D. The semiconductor may include a polycrystalline semiconductor such as polysilicon or other polycrystalline semiconductor or amorphous semiconductor material. The conductive metal compound may include, for example, a silicide, conductive metal nitride, etc., or a combination thereof.

Figure 14:
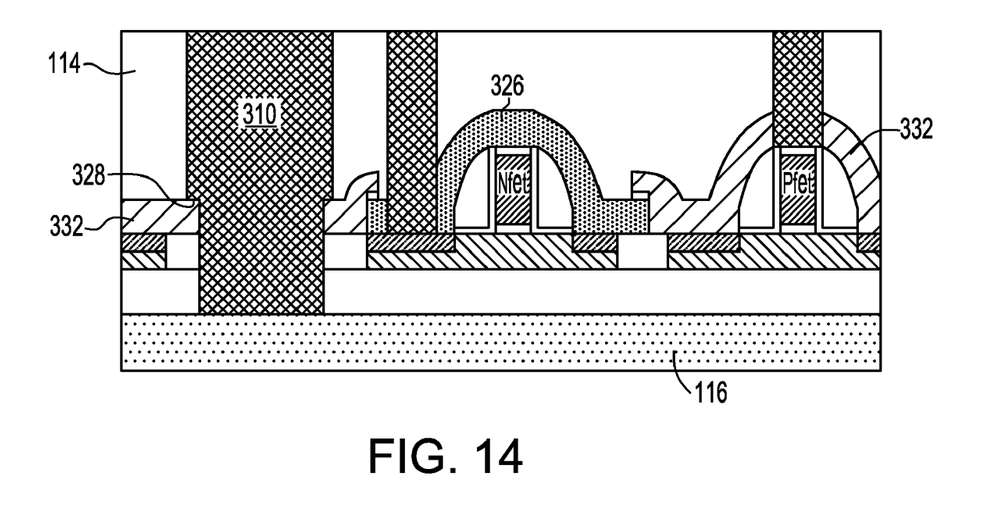
FIG. 14 is a sectional view illustrating a microelectronic element in accordance with a variation of the embodiment shown in FIG. 7D.

FIG. 14 illustrates a variation of the above-described embodiment (FIG. 7D) in which the conductive element 310, i.e., a conductive via or a guard ring as described above (FIGS. 7B-7C), contacts a lip portion 328 of a compressive-stressed nitride layer 332, instead of the tensile-stressed nitride layer.

Figure 15:
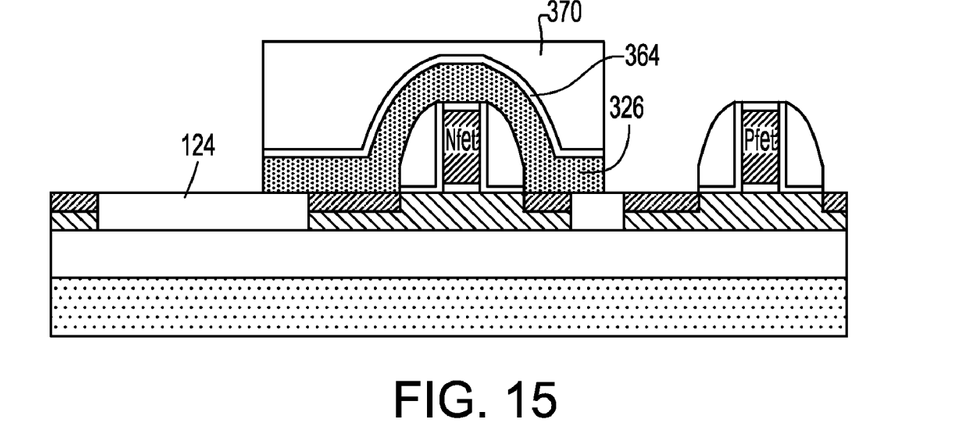
FIGS. 15-16 are sectional views illustrating stages in fabrication of the microelectronic element shown in FIG. 7D.
Figure 16:
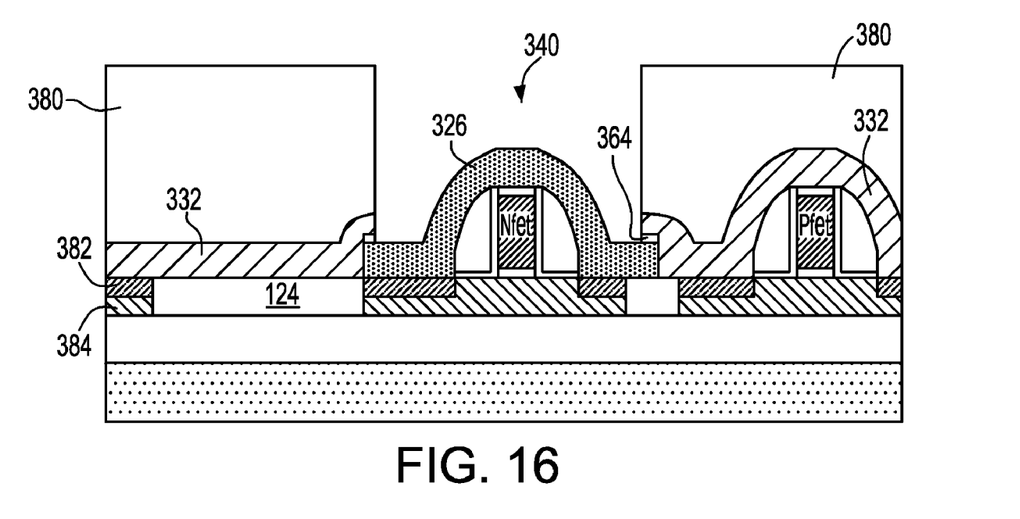

To fabricate the conductive element 310, the patterns on one photomask are varied such that in the resulting resist pattern 370 (FIG. 15) most of the STI region 124 is exposed, while the tensile-stressed nitride layer and oxide hard mask layer 364 overlying the NFET are protected by the resist. Subsequently, the compressive-stressed nitride layer 332 (FIG. 16) is deposited in contact with the STI region 124 and the silicide layer 382 or other low-resistance material overlying active semiconductor region 384 adjacent to the STI region. Thereafter, a photomask is used to define a resist pattern 380 having an opening through which the compressive-stressed nitride layer 332 and oxide hard mask layer 364 are removed from atop the NFET 340. The dielectric layer 114 (FIG. 14), e.g., an interlevel dielectric layer consisting essentially of an oxide is then formed, after which an opening is formed which exposes the bulk semiconductor region 116 by selectively etching through the dielectric layer 114 by a process which attacks or etches the dielectric layer 114 at a faster rate than the nitride material contained in the stressed nitride layer 332. The conductive element 310 (FIG. 14) then is formed in the resulting opening.

Figure 17:
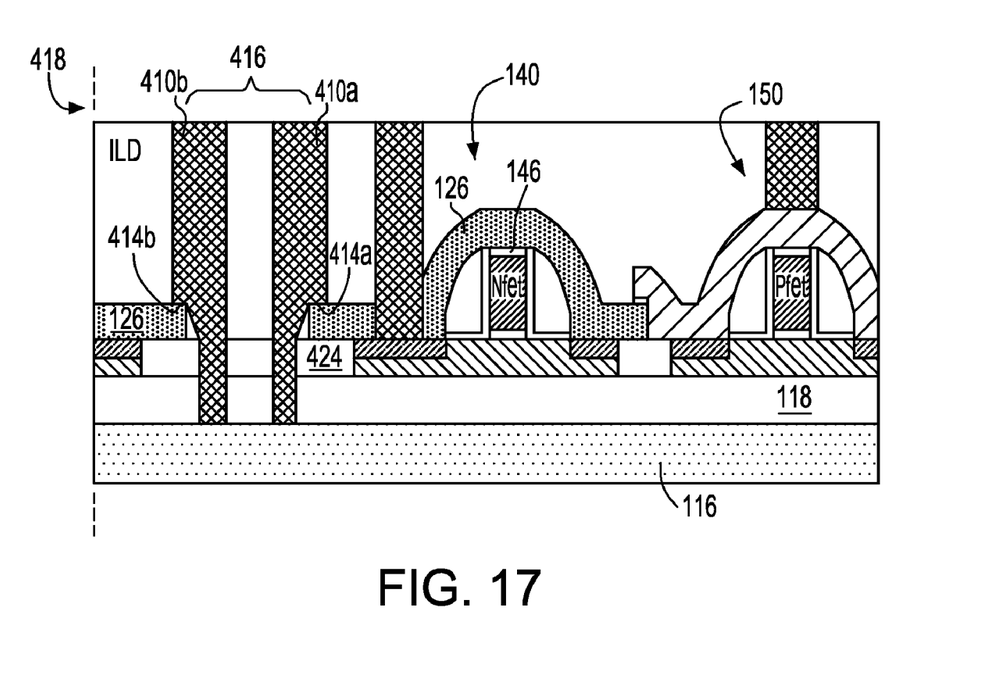
FIG. 17 is a sectional view illustrating another variation of the microelectronic element in accordance with an embodiment of the invention.

FIG. 17 illustrates another variation of the above-described process in which a pair of conductive elements 410a, 410b, e.g., guard rings, conductive vias, or a combination of a guard ring and a conductive via (FIGS. 7A-7B) are formed to extend through the STI region 424 and the buried dielectric layer 118 to provide conductive communication with the bulk semiconductor region 116. For example, as illustrated in FIG. 17, guard ring 410a overlies a lip portion 414a of a top surface of the tensile-stressed nitride layer 126 adjacent to a right edge of opening 416. Guard ring 410a also is also adjacent to microelectronic devices, e.g., NFET 140, and PFET 150. Guard ring 410b overlies a lip portion 414b of a top surface of the tensile-stressed nitride layer 126 adjacent to a left edge of opening 416. Guard ring 410b is adjacent to a dicing lane 418 of the chip.

Figure 18:
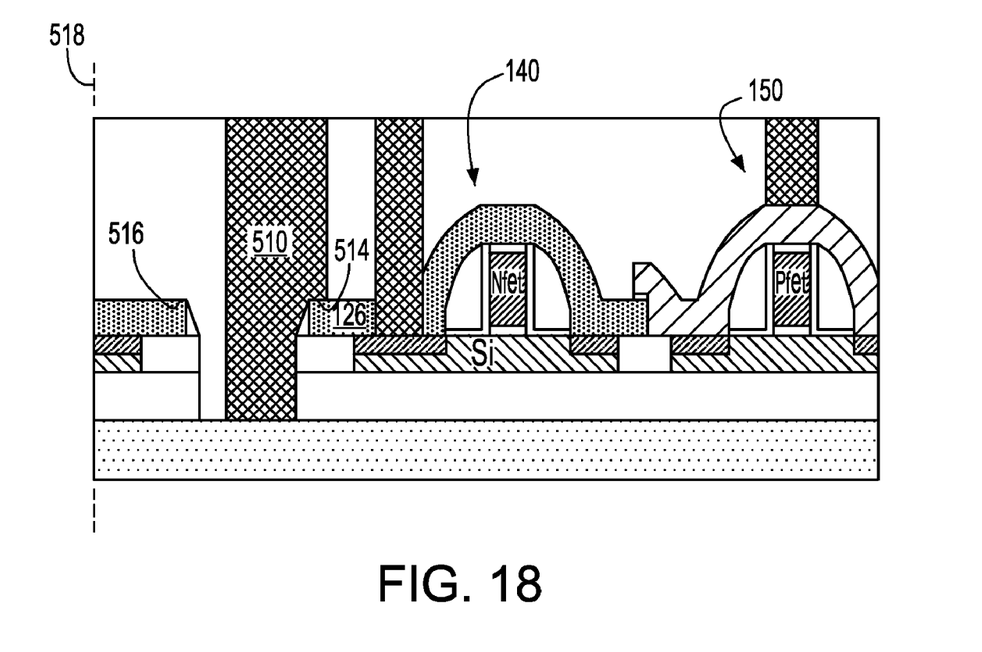
FIG. 18 is a sectional view illustrating another variation of the microelectronic element in accordance with an embodiment of the invention.

FIG. 18 illustrates another variation in which a guard ring 510 overlies a lip portion 514 at a right edge of a top surface of the tensile-stressed nitride layer 126 adjacent to microelectronic devices 140, 150 of the chip. On the other hand, the conductive element 510 does not overlie the lip portion 516 at a left edge (edge adjacent to dicing lane 518) of the tensile-stressed nitride layer 126. In similar manner, in another variation (not shown), the guard ring could be fabricated such that it overlies the lip portion at the left edge (edge adjacent to dicing lane 518) of the nitride layer without overlying the lip portion at the right edge (edge adjacent to microelectronic devices).

While the invention has been described in accordance with certain preferred embodiments thereof, many modifications and enhancements can be made thereto without departing from the true scope and spirit of the invention, which is limited only by the claims appended below.

What is claimed is:

1. A method of forming a conductive via in contact with a bulk semiconductor region of a semiconductor-on-insulator ("SOI") substrate, the bulk semiconductor region being separated from a SOI layer of the substrate by a buried dielectric layer, the method comprising:
   a) forming a first opening in a conformal layer overlying a trench isolation region, the trench isolation region sharing an edge with the SOI layer;
   b) depositing a dielectric layer over a top surface of the conformal layer and the trench isolation region;
   c) forming a second opening extending through the dielectric layer and the first opening in the conformal layer, such that portions of the bulk semiconductor region and the top surface of the conformal layer are exposed within the second opening; and
   d) filling the second opening with at least one of a metal or a semiconductor to form a conductive element contacting the exposed portions of the bulk semiconductor region and the top surface of the conformal layer.

2. The method as claimed in claim 1, wherein the first opening has a first width, the second opening has a second width greater than the first width, and the exposed portion of the top surface of the conformal layer includes a left portion adjacent to a left edge of the first opening and a right portion adjacent to a right edge of the first opening opposite from the left edge.

3. The method as claimed in claim 2, wherein a first stressed nitride layer having a first one of tensile stress or compressive stress is exposed at the left exposed portion of the top surface and a second stressed nitride layer having a second one of tensile stress or compressive stress other than the first one is exposed at the right portion of the exposed top surface.

4. The method as claimed in claim 1, wherein the first opening has a width and a length, each aligned with a major surface of the SOI substrate, wherein the length is more than ten times greater than the width.

5. The method as claimed in claim 4, wherein the SOI layer includes a device region and the element at least substantially surrounds the device region.

6. The method as claimed in claim 1, further comprising extending the first opening through the buried dielectric layer to expose a surface of the bulk semiconductor region prior to depositing the dielectric layer.

7. The method as claimed in claim 6, wherein the dielectric layer deposited in step (b) covers the surface of the bulk semiconductor region within the first opening and step (c) includes exposing only a portion of the surface of the bulk semiconductor region within the first opening.

8. The method as claimed in claim 6, wherein the dielectric layer deposited in step (b) covers the exposed surface of the bulk semiconductor region within the first opening and step (c) includes forming two adjacent second openings laterally separated from each other by a portion of the dielectric layer.

9. The method as claimed in claim 8, wherein one of the adjacent second openings exposes a left portion of the top surface of the conformal layer adjacent to a left edge of the first opening and the other of the adjacent second openings exposes a right portion of the top surface of the conformal layer adjacent to a right edge of the first opening.

* * * * *